United States Patent [19]
Sawai et al.

[11] Patent Number: 5,528,509
[45] Date of Patent: Jun. 18, 1996

[54] METHOD OF DESIGNING A HIGH-FREQUENCY CIRCUIT

[75] Inventors: Tetsuro Sawai; Shigeyuki Murai; Tsutomu Yamaguchi; Yasoo Harada, all of Moriguchi, Japan

[73] Assignee: Sanyo Electric Co., Ltd., Osaka, Japan

[21] Appl. No.: 214,821

[22] Filed: Mar. 17, 1994

[30] Foreign Application Priority Data

Mar. 17, 1993 [JP] Japan ................................. 5-057456

[51] Int. Cl.⁶ ........................................... H03F 3/16
[52] U.S. Cl. ..................... 364/488; 364/480; 364/489; 330/253
[58] Field of Search ................................. 364/480, 488, 364/489; 330/253, 261; 395/919, 500, 908, 920

[56] References Cited

U.S. PATENT DOCUMENTS 4,511,978  4/1985  Reug ........................ 364/480

OTHER PUBLICATIONS

JRG. Twisleton, The ABCD, Z and Y Matrix Description of Microwave Transistors, Microwave Journal, pp. 141, 143, 144, 146, 150, 152, 155, 156.

"Large–Signal Analysis for Microwave FETs Using S–Parameters" (Yoshio Aoki & Jun Fukaya)—The 3rd Asia–Pacific Microwave Conference Proceedings, Tokyo, 1990.

*Primary Examiner*—Ellis B. Ramirez
*Assistant Examiner*—Thomas Peeso
*Attorney, Agent, or Firm*—Darby & Darby

[57] ABSTRACT

The S-parameters of a transistor are measured at a plurality of bias points, and using a tentatively decided load resistance value, the S-parameters on the load curve are examined, based on which the power gain and input/output power characteristics are obtained to determine the optimum load. Then, by using a linear simulator, input and output circuits are designed so that the optimum load can be realized.

2 Claims, 10 Drawing Sheets

5,528,509

METHOD OF DESIGNING A HIGH-FREQUENCY CIRCUIT

BACKGROUND OF THE INVENTION

1. Field of the Invention

The present invention relates to a method of designing a high-frequency circuit such as a high-frequency linear amplifier for signals of high power level.

2. Description of Related Art

A method previously employed to design a high-frequency linear amplifier for high power level (usually −30 dBm or higher) signal, with a field-effect transistor (FET) is as follows.

Once the amplifier specification is determined, an FET that matches the specification is selected, and its ID-VD (drain current—drain voltage) characteristics, S-parameters, etc. are measured. Then, the values that match the results of the measurement are inputted to an FET model provided in a nonlinear circuit simulator. An input matching circuit and an output matching circuit are designed so that the desired characteristics such as gain, maximum linear power, saturation power, etc. can be obtained.

Among the commercially available nonlinear circuit simulators are the "MDS" manufactured by Hewlett Packard and "Microwave Harmonica" by Compact Software.

However, FET models provided in nonlinear circuit simulators do not have sufficient accuracy that can faithfully reproduce the actually measured values, for example, in low drain voltage regions and deep gate bias regions. As a result, models that can only match the actually measured values at some of the bias points have to be used. This has led to the problem that circuit design with good accuracy cannot be made. Furthermore, when using such models, such parameters as mutual conductance, gate-source capacitance, etc. have to be set to match the measurement results. The problem here is that selecting optimum values for these parameters takes considerable time.

SUMMARY OF THE INVENTION

The present invention has been devised to overcome the above problems. An object of the invention is to provide a method of designing a high-frequency circuit, wherein actually measured values are used, thereby realizing highly accurate simulation and reducing the time needed for designing work.

The invention provides a method of designing a high-frequency circuit for large-signal levels including an amplifier containing a transistor, an input matching circuit, and an output matching circuit. In the method there is a first step of measuring at least S-parameters of said transistor at various bias points; a second step of calculating S-parameters by using said measured S-parameters on a load line by tentatively deciding a lead resistance value for said transistor; a third step of calculating power gains of said amplifier using said calculated S-parameters under the condition that an input port of said transistor is conjugately matched and an output port is terminated at said lead resistance, and predicting an input versus output, power characteristic of said amplifier by using said power gains; a fourth step of judging a suitability of said power gains and input, versus output characteristics; and a fifth step of repealing the second anti later steps when said power gains and said input versus output characteristic are judged as being unsuitable in the fourth step, and of designing, by using a linear circuit simulator, said output matching circuit for realizing said tentatively decided lead resistance value, and said input matching circuit for realizing substantially conjugately matching when said power gains and said input versus output characteristic are judged as being suitable.

According to the method of the invention, since actually measured values are used, there is no need to determine the FET's equivalent circuit constants (values or parameters for the previously mentioned model). Furthermore, the input/output circuits can be designed using the highly accurate FET characteristics based on the actually measured values, which helps to complete the desired circuit design in a short period of time.

The above and further objects and features of the invention will more fully be apparent from the following detailed description with accompanying drawings.

DETAILED DESCRIPTION OF THE PREFERRED EMBODIMENTS

The present invention will be described in detail below with reference to the accompanying drawing illustrating an embodiment of a high-frequency linear amplifier design with a GaAs FET.

Figure 1:
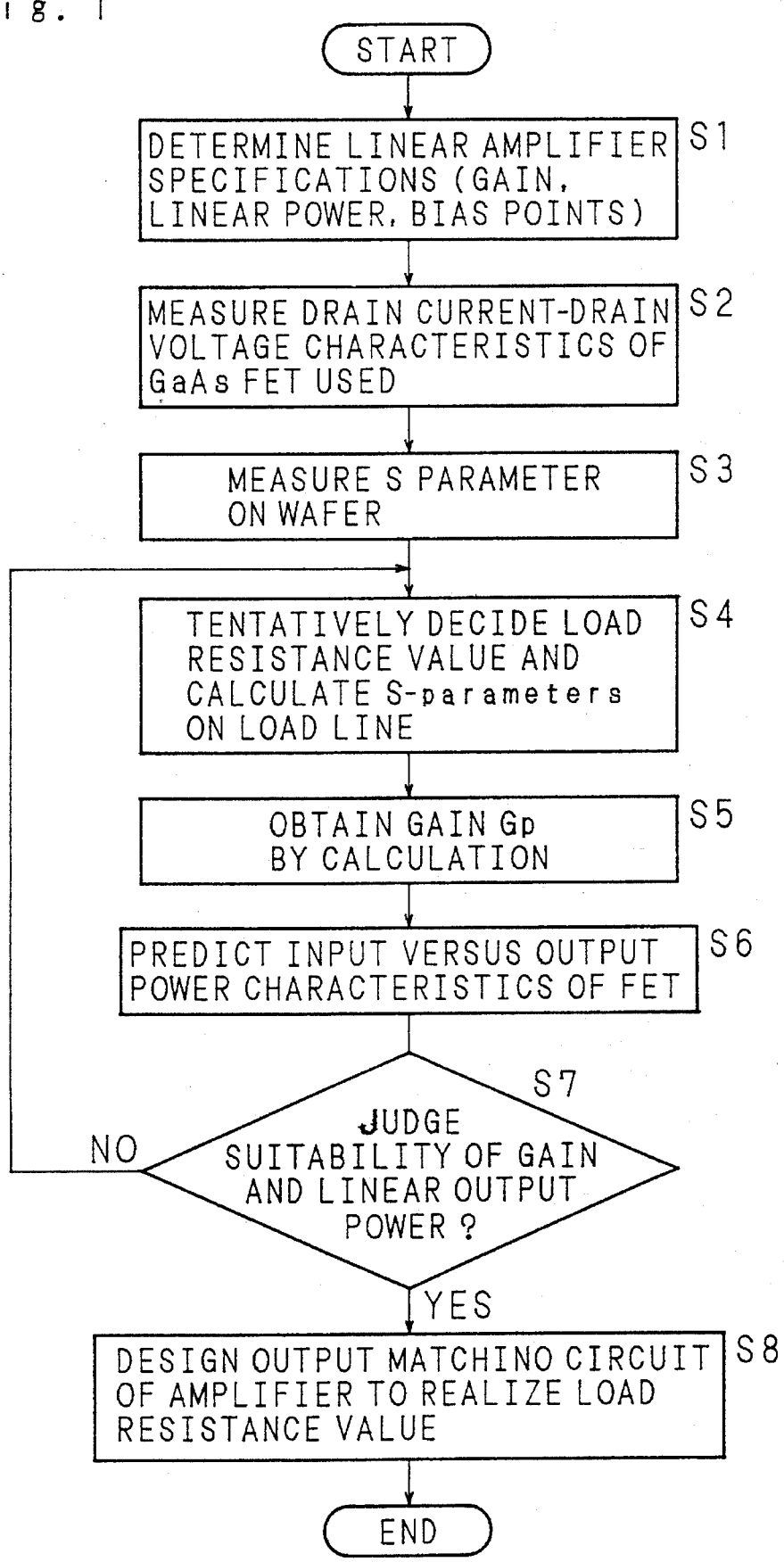
FIG. 1 is a flowchart illustrating a procedure for the method of the present invention.
Figure 2:
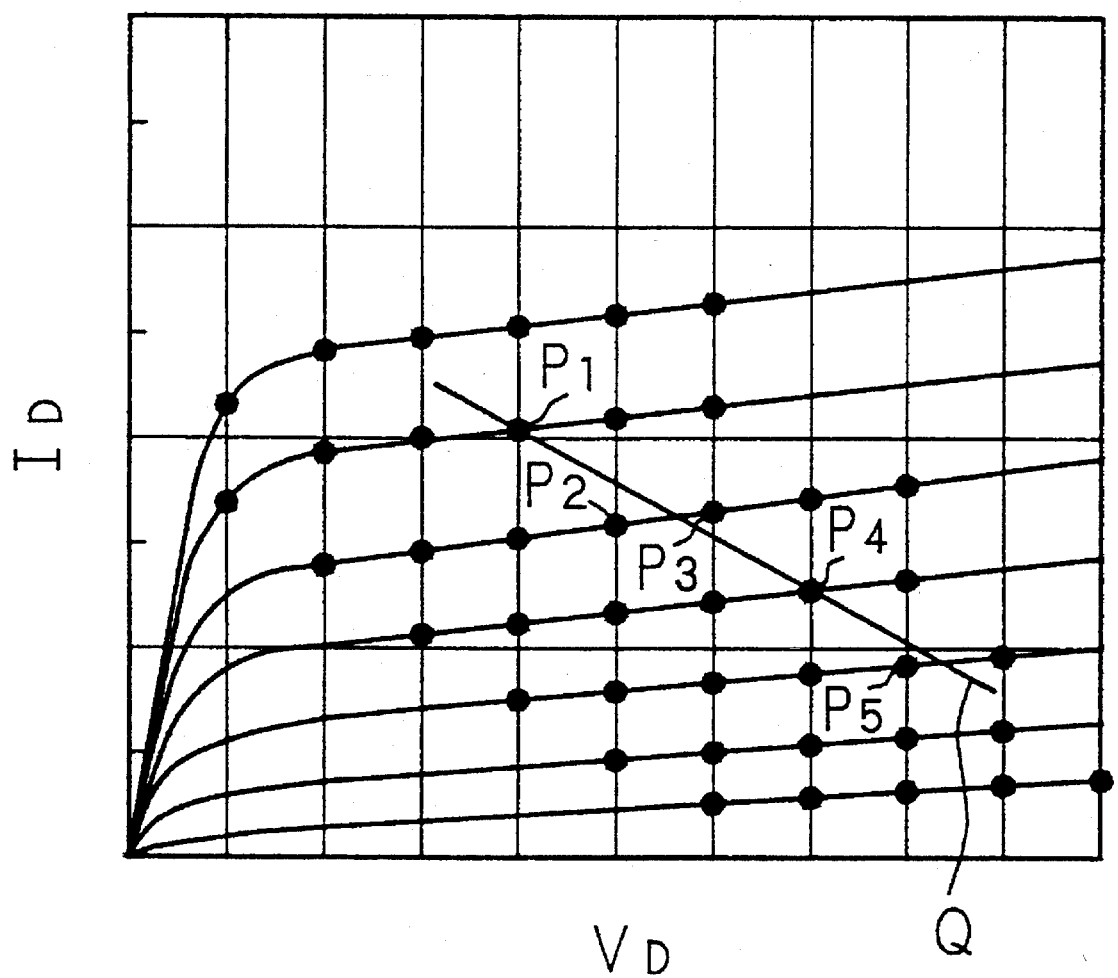
FIG. 2 is an ID—VD characteristic diagram for a transistor.

FIG. 1 is a flowchart illustrating a procedure for the design method of the present invention. First, the specifications (gain, linear power, bias points, etc.) of the amplifier to be designed are determined (S1). Next, the drain current ID—drain voltage VD characteristics of the FET to be used are measured (S2). FIG. 2 shows the results of this measurement, with the gate bias as a parameter. Next, the S-parameters of this FET as fabricated on the wafer is measured at various bias points (P1, P2, . . . , P5) (S3). The bias points, P1, P2, . . . , P5, are set by appropriately selecting values near the bias points provided in the amplifier specification.

Figure 3:
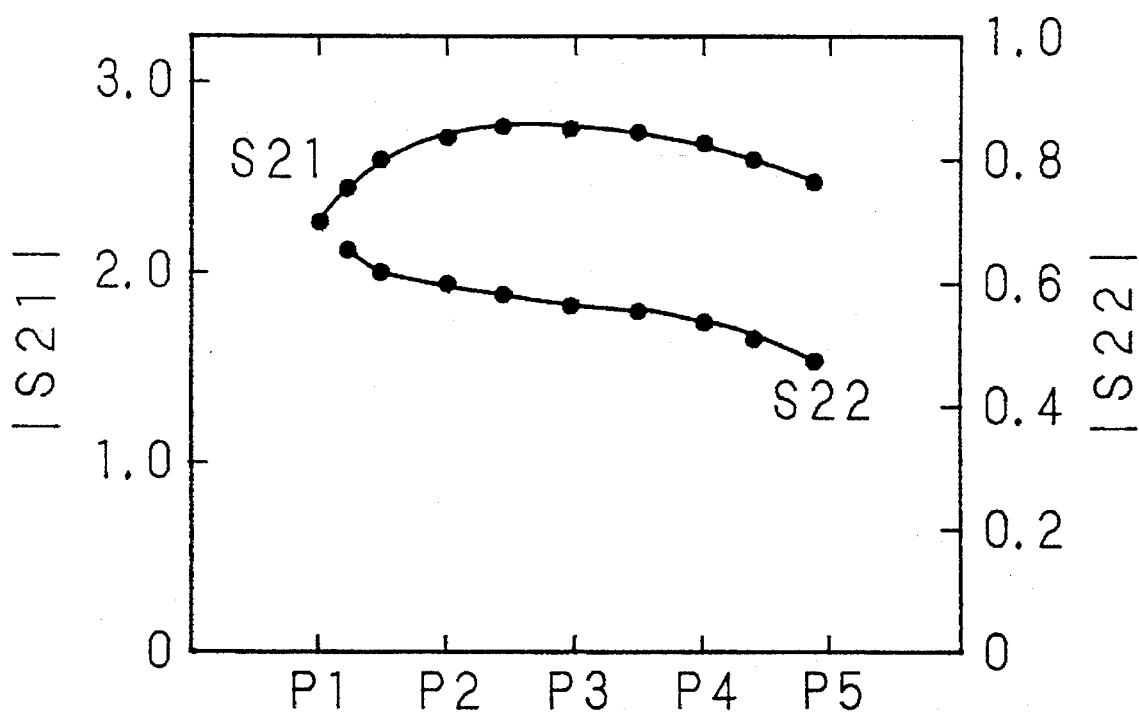
FIG. 3 is a graph showing the dependence of S-parameters on bias.
Figure 4:
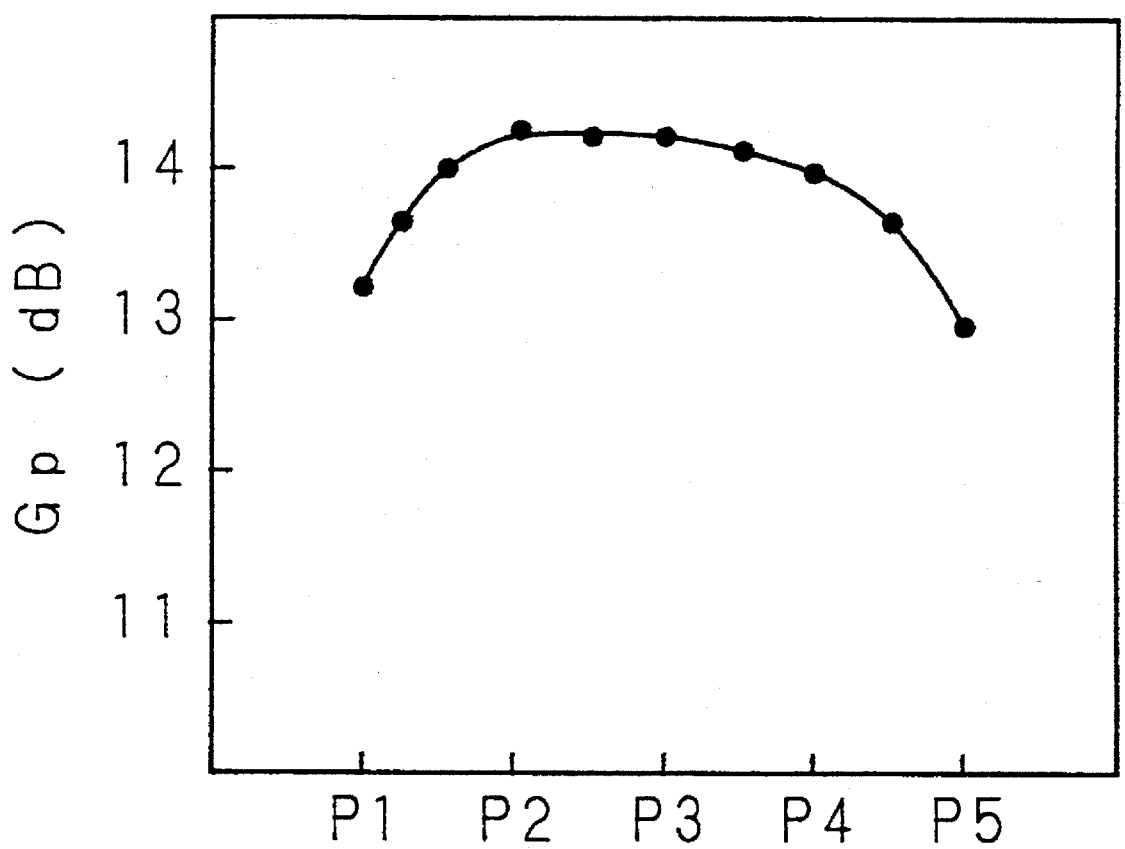
FIG. 4 is a graph showing the dependence of power gain on bias.

Next, a load resistance (load impedance) value (Q in FIG. 2) is tentatively decided empirically or with reference to the ID—VD characteristics. Using the measured S-parameters (measurement is made with 50Ω terminal resistance), S-parameters on the load curve are calculated (S4). FIG. 3 shows the results, which show the dependence of S-parameters S21, S22 on bias. Using these S-parameters, small-signal power gain GP is calculated (S5). FIG. 4 shows the results.

Figure 5:
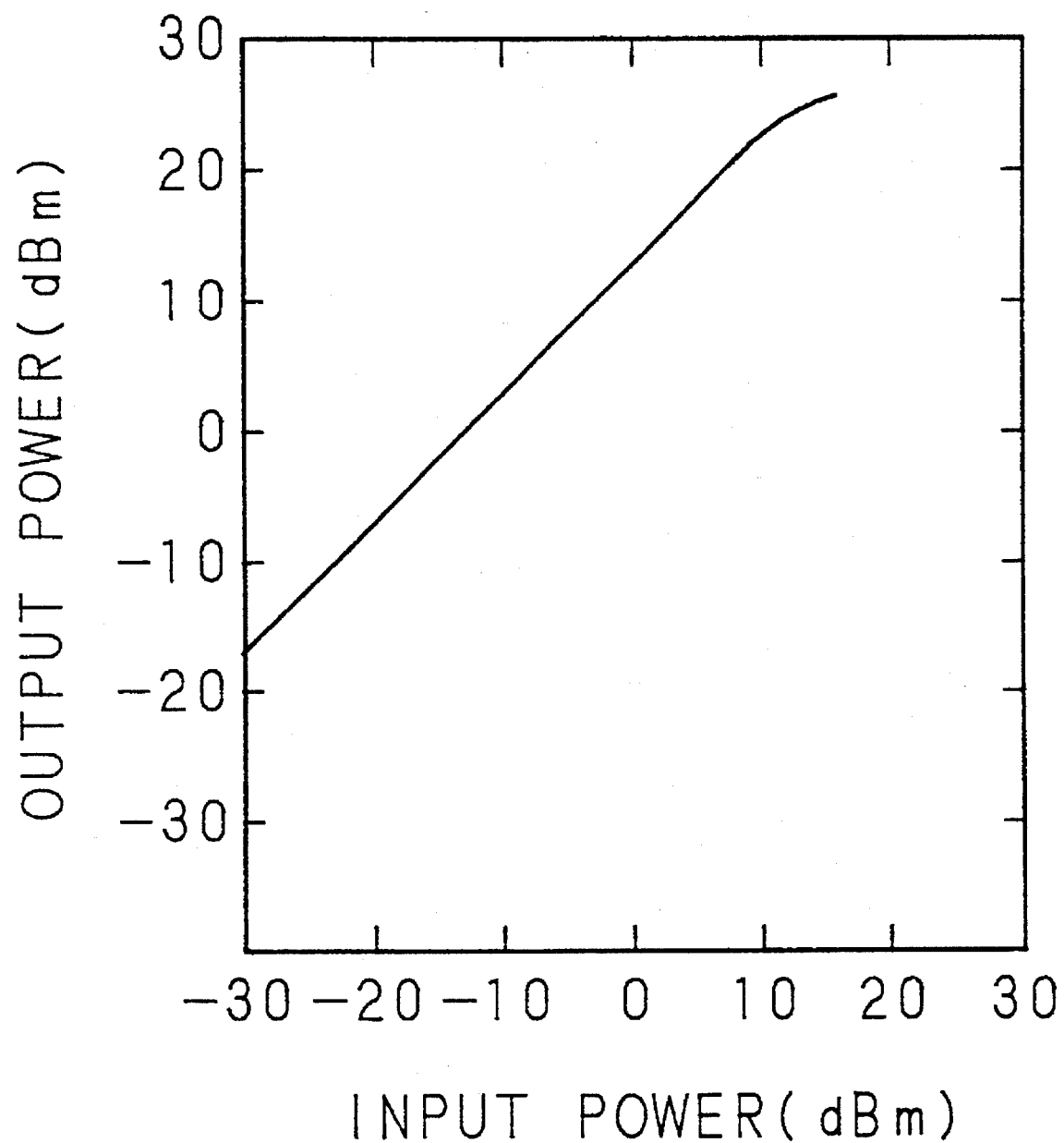
FIG. 5 is an input/output power characteristic diagram.

From the measured and calculated results with low power signals (usually less than −30 dBm), the input/output power (linear power) characteristic of the FET is predicted (S6). FIG. 5 shows an example of the prediction. Calculations made in steps S4–S6 will be described later.

Next, the results shown in FIGS. 4 and 5 are examined to determine whether the obtained power gain and linear maximum output satisfy the specifications (S7). If they do not satisfy the specifications, the process returns to S4, where the tentatively decided load resistance value is changed, and steps S4–S7 are repeated. In step S7, if the results are found to satisfy the desired specifications, then an output matching circuit that realizes the tentativey decided load resistance value is designed by using a nonlinear circuit simulator.

The "Super Compact" product manufactured by COMPACT SOFTWARE, for example, is used as the linear simulator.

Calculations performed in steps S4–S6 will be described below by giving a 1.9-GHz, 80-mW liner output amplifier as an example.

Figure 6:
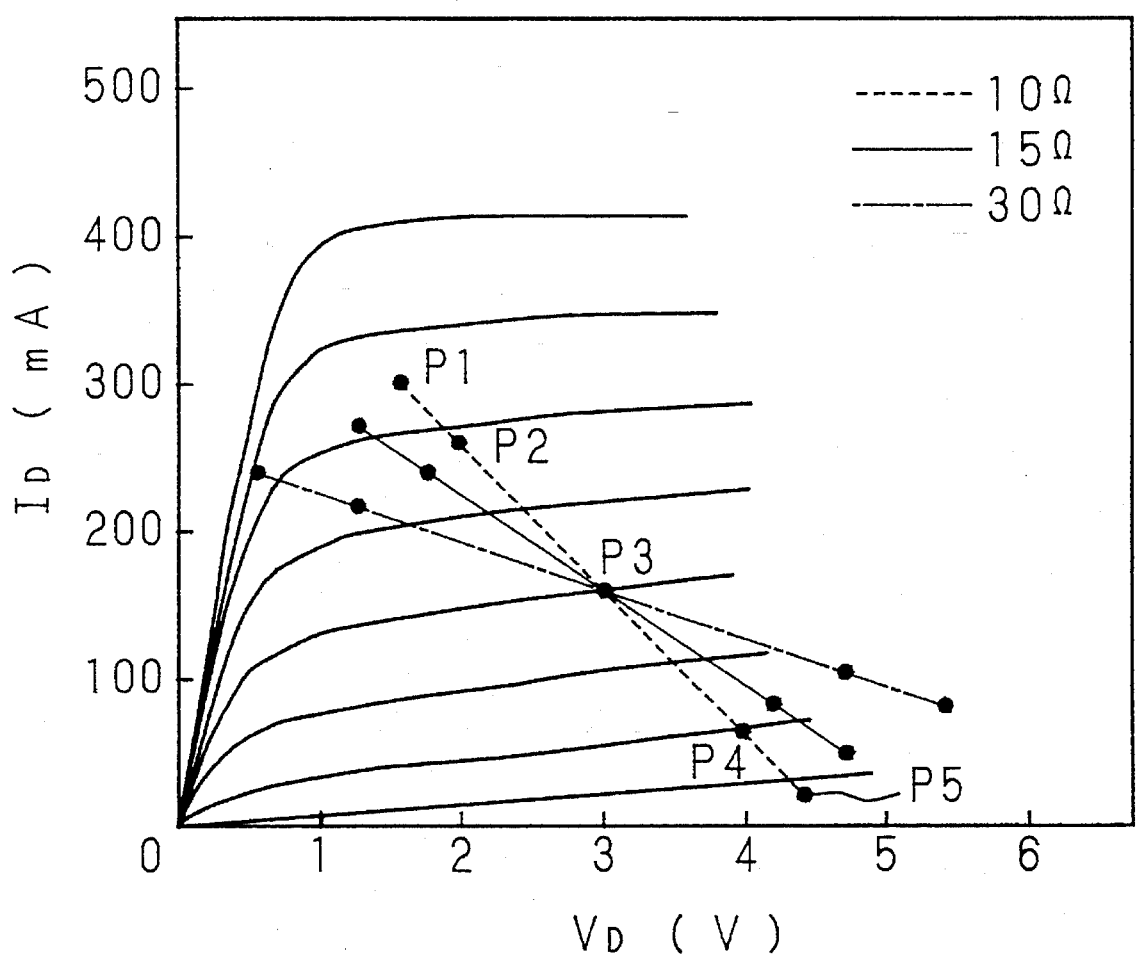
FIG. 6 is an ID—VD characteristic diagram for a transistor.

For an FET having the ID—VD characteristics shown in FIG. 6, three kinds of load resistors ΓL, 10, 15, and 30Ω, respectively, are assumed for use here. In the FIG., P3 corresponds to the DC bias point of the amplifier, while P1 and P5 indicates the range for obtaining a 100 mW output, and P2 and P4 the range for obtaining a 50 mW output.

First, from the S-parameters measured with respect to the ID—VD characteristics, S-parameters on the respective load curves are obtained (at bias points where there are no actually measured values, the parameter phase and magnitude are interpolated using its preceding and succeeding data).

Next, using the S-parameters, S11–S22, obtained on the load curves, the input is gain-matched (the input impedance ΓIN is set to the value shown in Equation (1)), and to the values obtained when the output is matched to the assumed load impedance ΓL, namely to the values obtained when the amplifier is thus constructed, the S-parameters are converted by using Equation (2).

$$\Gamma IN = S11 + (S12 \cdot S21 \Gamma L)/(1 - S22 \Gamma L) \quad (1)$$

$$\begin{array}{c} \Gamma_{in} \\ \Gamma_1 \\ S'_{11}\ S'_{12}\ S'_{21}\ S'_{22} \end{array} \quad (2)$$

Figure 7:
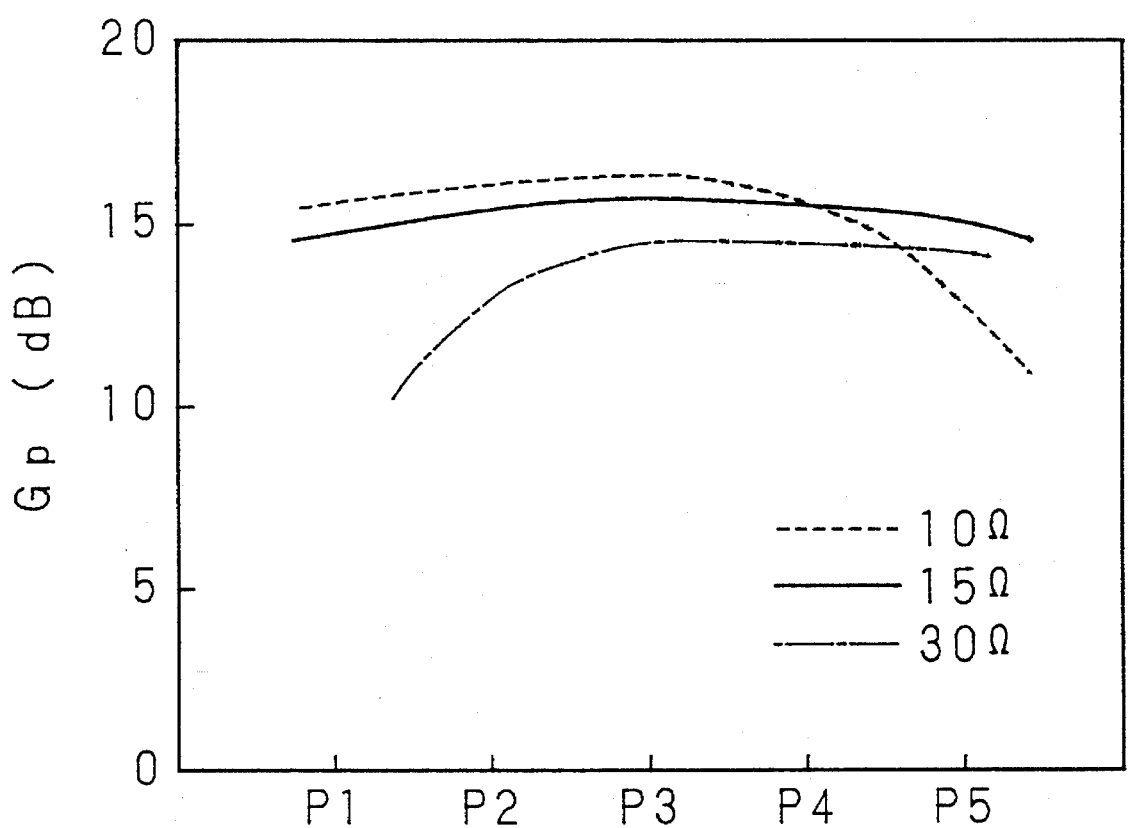
FIG. 7 is a graph showing the dependence of power gain on bias.

The forward transfer coefficient of the value thus obtained represents the power gain GP of the amplifier for small signals. Therefore, the smaller the bias-dependence of GP on the load curve, the better the linearity. FIG. 7 shows the dependence of GP on bias, obtained for the three kinds of loads. As shown, the dependence on bias is the smallest for the 15Ω load.

When the optimum load impedance is decided as 15Ω in this manner, the output level is obtained from the dependence of GP on bias. That is, assuming that a large-signal is a collection of low power signals on ID—VD and that reflections at the input are very small (there is no mismatching), the gain GPL for large signals can be expressed by Equation (3).

$$GPL = \int GpdA \quad (3)$$

Since the output is the product of the input power and the integrated value of the small-signal gain Gp, the input/output characteristic can be obtained by using the above equation.

Figure 8:
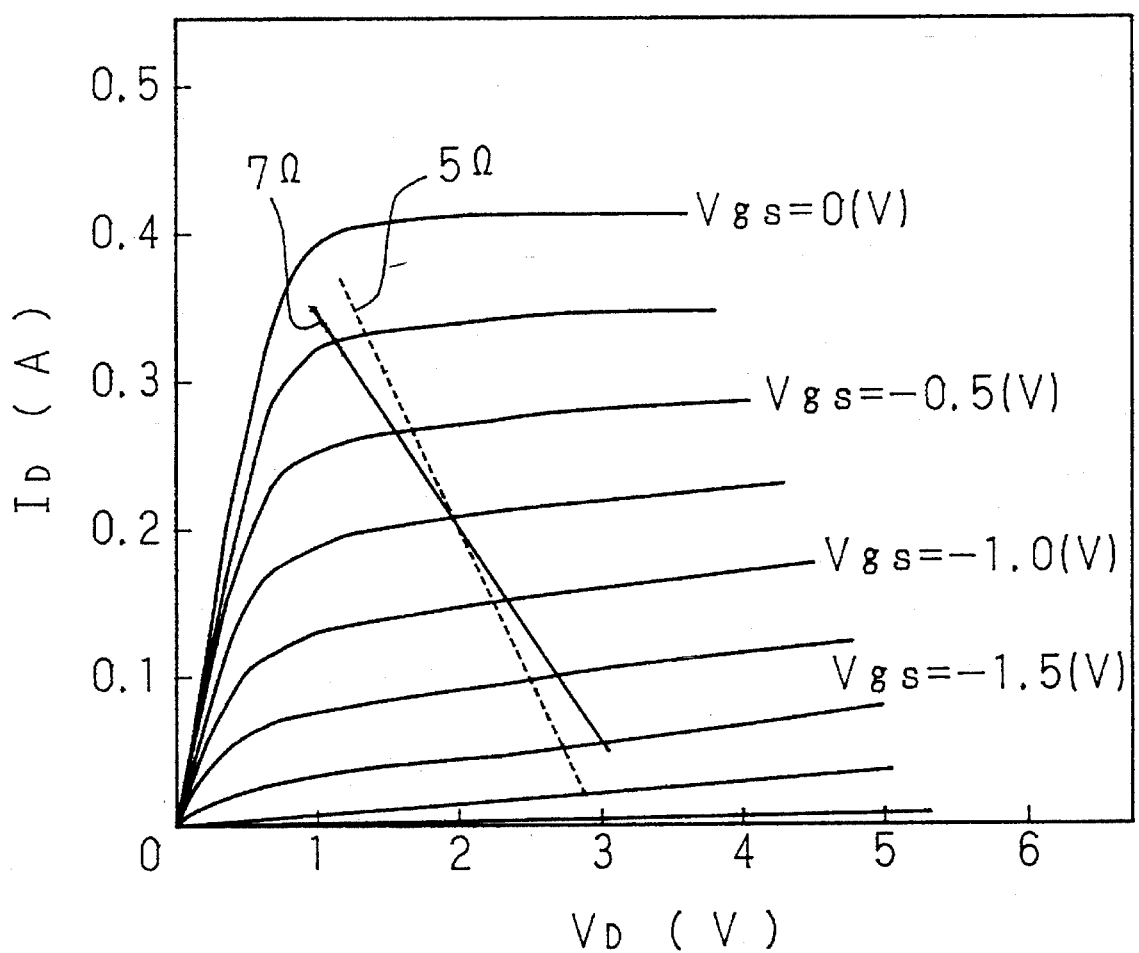
FIG. 8 is an ID—VD characteristic diagram.
Figure 9:
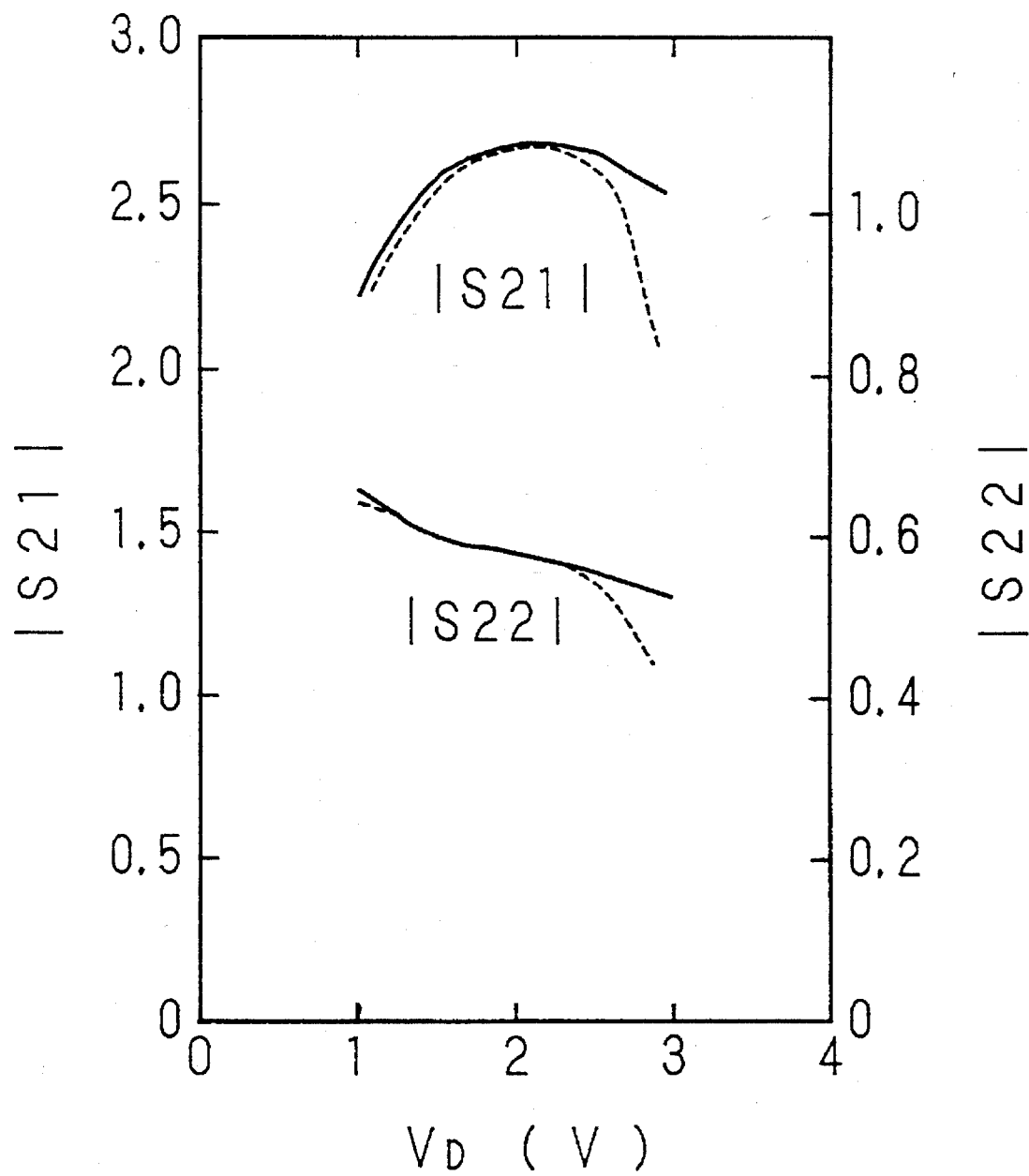
FIG. 9 is a graph showing the dependence of S-parameters on bias.
Figure 10:
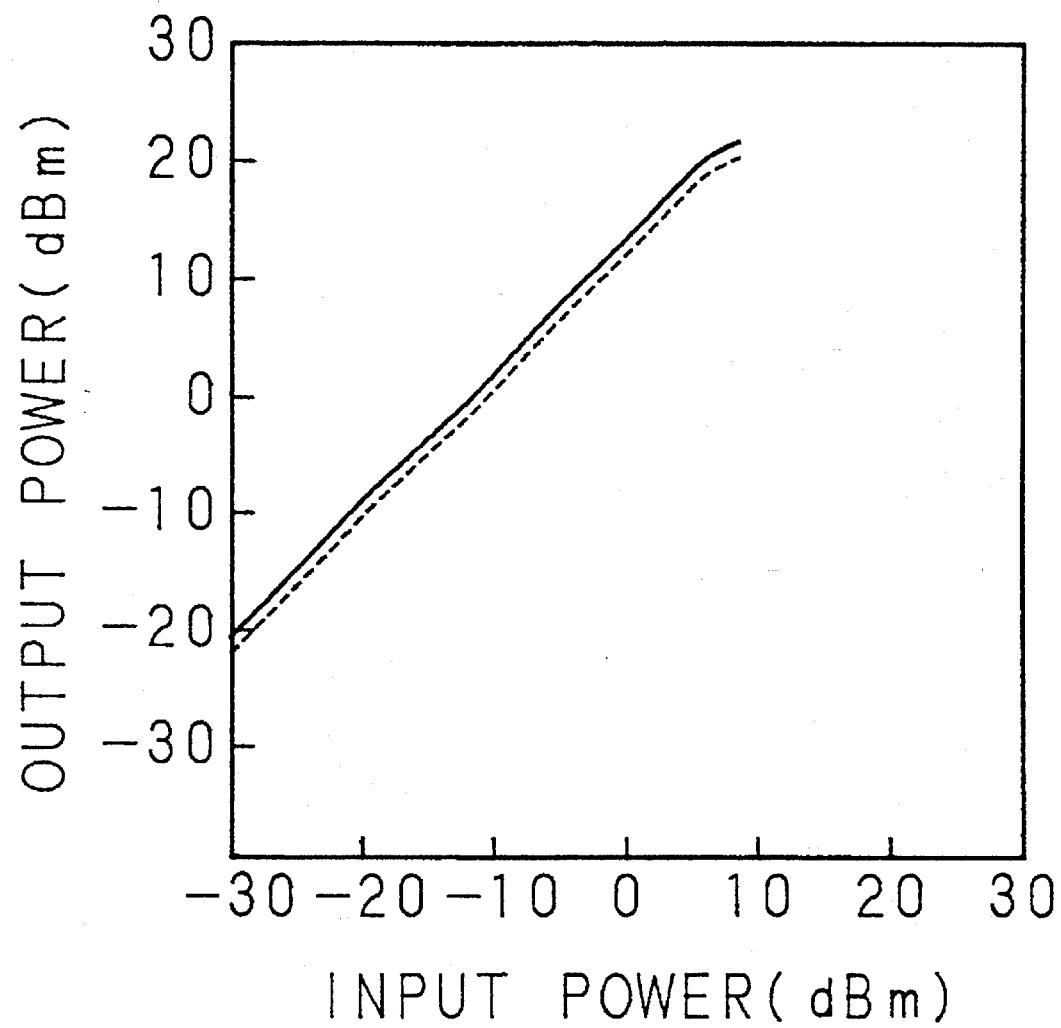
FIG. 10 is an input/output power characteristic diagram.

FIGS. 8 to 10 also show specific numerical examples. FIG. 8 shows ID—VD characteristics, and Vgs indicates the gate bias voltage. A load resistances of 5Ω is shown by a dashed line and 7Ω shown by a solid line are assumed for use. FIG. 9 shows the variations of the S-parameters S21 and S22 at three bias points, VD=1, 2, and 3 V, with the dashed line for 5Ω and the solid line for 7Ω.

FIG. 10 shows input/output characteristics, with the dashed line for 5Ω and the solid line for 7Ω. From FIG. 9, it can be seen that the dependence on bias is smaller for 7Ω indicated ed by the solid line. FIG. 10 shows that the linear output is larger for the load resistance (7Ω shown by the solid line) having the smaller dependence on bias.

This result indicates that the linear output can be predicted from the bias-dependence.

The present invention is not limited to an FET, but can also be applied to circuit design using a bipolar transistor.

According to the present invention, since the FET characteristics based on the actually measured values are inputted to the linear simulator, as described above, accurate FET simulation can be performed, so that a circuit with the desired specification can be designed in a shorter period of time.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A method of designing a high-frequency circuit for large-signal levels for a linear amplifier containing a transistor, an input matching circuit, and an output matching circuit thereof, comprising:

(a) first measuring at least S-parameters of said transistor at various bias points;

(b) tentatively determining a load line with respect to load resistance for said transistor;

(c) next calculating S-parameters by use of said measured S-parameters on said tentatively determined load line;

(d) calculating power gains of said amplifier using said calculated S-parameters under the condition that an input port of said transistor is conjugately matched and an output port is terminated at said load resistance, and predicting an input versus output power characteristic of said amplifier by using said power gains;

(e) next judging suitability of said linearity of power gains and linear maximum power characteristic; and (f) repeating steps (b)–(e) when said linearity of said power gains and said linear maximum output characteristic are judged as being unsuitable in step (e) and of designing said high-frequency circuits on the basis of said tentative load line, by using a linear circuit simulator, when said power gains and said input versus output characteristics are judged as being suitable.

2. A method as in claim 1 wherein the load line is a function of the $I_D$-$V_D$ characteristic of the transistor.

* * * * *